United States Patent [19]

Dhuyvetter

[11] Patent Number: 4,684,898
[45] Date of Patent: Aug. 4, 1987

[54] TEMPERATURE AND PROCESS VARIATION COMPENSATION FOR A DELTA DEMODULATION DECODER

[75] Inventor: Timothy A. Dhuyvetter, San Jose, Calif.

[73] Assignee: Signetics Corporation, Sunnyvale, Calif.

[21] Appl. No.: 734,417

[22] Filed: May 15, 1985

[51] Int. Cl.$^4$ .............................................. H03K 9/00
[52] U.S. Cl. .................................... 329/104; 329/109; 329/110; 375/28; 375/34
[58] Field of Search ................. 329/104, 109, 50, 110; 375/28, 34, 94; 455/296, 337

[56] References Cited

PUBLICATIONS

"An Audio Broadcast System Using Delta Modulation", Kenneth Gundry, Dolby Laboratories, Inc.
"A Digital Audio System for Broadcast and Prerecorded Media", Todd et al., Dolby Laboratories, Inc., 75th AES Convention, Mar. 27-30, 1984, Paris.
"Recent Developments in Digital Audio Techniques", Gundry et al., Dolby Laboratories, 73rd AES Convention, Mar. 15-18, 1983, Eindhoven, The Netherlands.
Product specification sheet for Signetics NE5240 Dolby digital audio recorder.

Primary Examiner—Eugene R. Laroche
Assistant Examiner—Robert J. Pascal
Attorney, Agent, or Firm—Jack E. Haken; James J. Cannon, Jr.

[57] ABSTRACT

A circuit for processing the control signal inputs for a control data signal decoder wherein a reference voltage and a reference current are generated for use in processing a stream of control signal bits. The control signal data stream is filtered, buffered and exponentialed. The processing serves to cancel out variations in temperature, resistance, process variations and circuit voltages to yield a stable control signal current.

2 Claims, 1 Drawing Figure

TEMPERATURE AND PROCESS VARIATION COMPENSATION FOR A DELTA DEMODULATION DECODER

BACKGROUND OF THE INVENTION

This invention pertains to a temperature and process variation compensation technique and a circuit incorporating said technique for use in processing a stream of control signal bits. The control signal data stream is filtered, buffered an exponentialed. The processing serves for use in a delta modulation decoder integrated circuit for high quality audio systems. The integrated circuit of this invention is a decoder for the receiver of a digital audio broadcasting system, the decoder having input logic and linear circuits capable of decoding two channels of delta modulated digital data.

The decoder receives three data bit streams that represent the audio information to be decoded. Two of these streams are control data bits, while one stream is the audio data bit stream. Clock bits are also received by the decoder. Each of the three data bit streams can be several channels of time multiplexed data. The clock is used as a strobe to select two of the channels. The circuit disclosed herein is suitable for the decoder.

The input logic of the decoder includes a number of edge triggered D flip-fops which are used as input latches to store the two channels of audio and control data.

The two control data bit streams for each channel are for step-size and system de-emphasis control. A current $I_{SS}$ is used to generate the amplitude of the output signal. A current $I_{SB}$ is used to control the frequency response. Since both currents are generated by the same circuit, this specification will discuss only one of them, $I_{SS}$. Information for the control data is encoded logarithmically in the duty cycle of the bit stream. For each of the control data bit streams, a three-pole, 80 Hz., low-pass filter is used to detect the average or DC value of the duty cycle. The resulting control voltage is then exponentiated to expand the control signal into a 48 dB range.

SUMMARY OF THE INVENTION

To maintain the system accuracy it is necessary to have precise control of the pulse height to be filtered. This is accomplished by using a switching amplifier to drive the low-pass filter. The latch output of the flip-flop sets the switching rate between two voltage levels, $V_L$ and $V_H$. These voltages are generated in a bandgap reference circuit which produces a voltage $V_B$ that is nearly independent of temperature, supply and process variations. VBG is scaled up to a voltage $V_3$ and results in a fixed reference voltage $V_L$. $V_M$ is chosen to be 40% of $V_H - V_L$. A low temperature coefficient reference current $I_{REF}$ is generated by an external resistor and is used in the exponentiator circuit. The control signal at the output of the low pass filter is buffered by an amplifier and attenuated by resistors to reduce any accumulated offset errors. The collector current of the actual exponentiating transistor is the control signal current $I_{SS}$. To properly bias this transistor and the other exponentiating transistors, a reference voltage generator circuit is incorporated.

The temperature and process spread compensation technique discolsed in this application allows the control signal $I_{SS}$ within the integrated circuit to be relatively independent of variations in temperature, process spreadings, resistance and $V_{CC}$. The effect of this compensation is to allow the use of the IC over a wide temperature range without the loss of performance and to increase the manufacturing yield of the IC.

The rest of the circuit is devoted to the processing of the audio signal as a function of the control data which has passed through the compensation technique of the present invention. The circuit is designed such that by use of a reference voltage and a reference current, variations of internal resistance and temperature can be cancelled to yield control signals that are independent of temperature, voltage and resistance as well as manufacturing variations.

BRIEF DESCRIPTION OF THE DRAWINGS

The FIGURE is a circuit diagram of the input logic, the reference generator and the exponentiator circuits used in the compensation technique of the present invention.

DESCRIPTION OF THE PREFERRED EMBODIMENT

Figure 1:
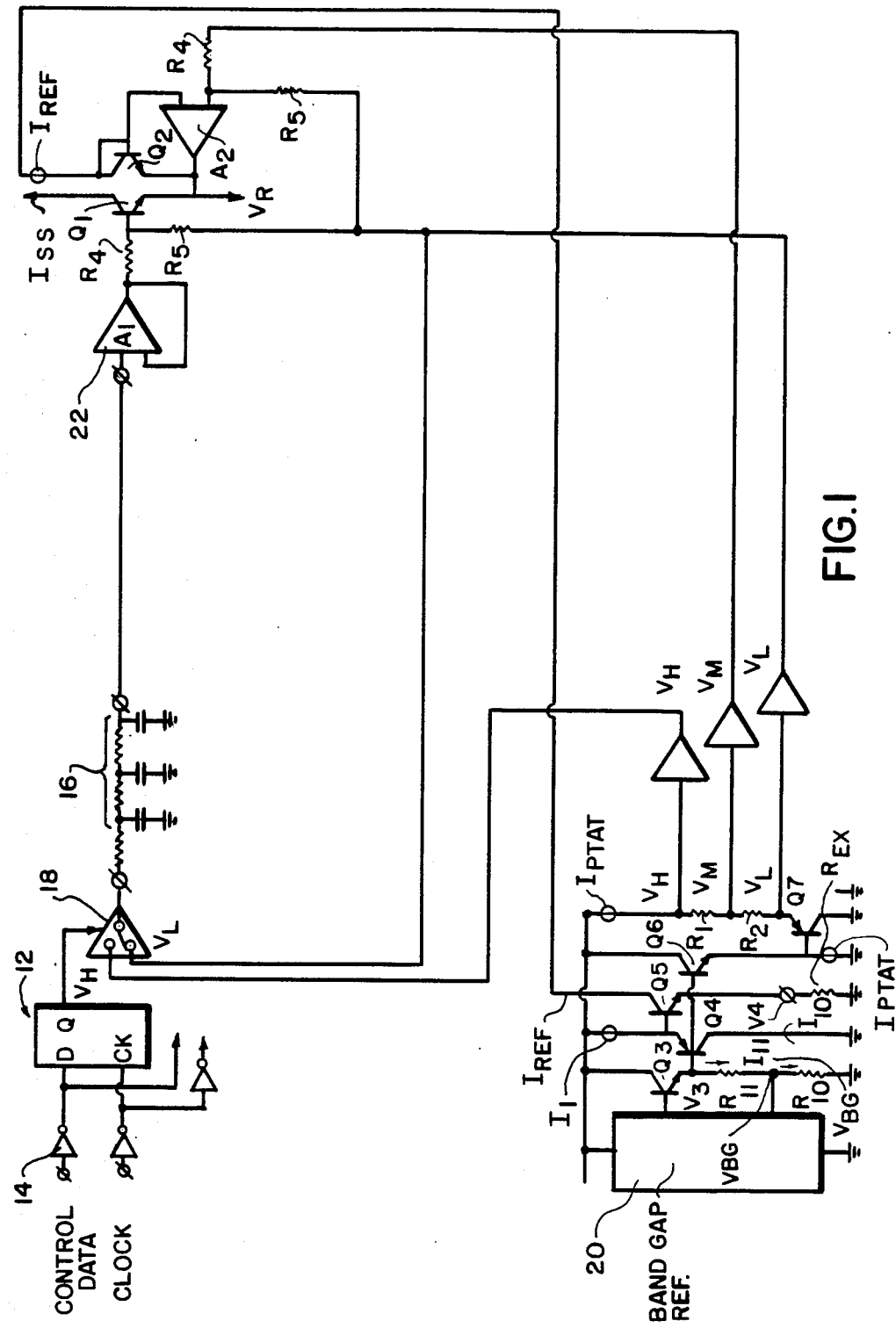

Before discussing in detail the preferred embodiment as illustrated in the FIGURE, the definitions and equations used in the design of the circuit will be presented.

A. Definitions a = duty cycle
c = constant
$I_s$ = transistor saturation current
$V_T = KT/q$, the voltage equivalent of temprature
$I_{PTAT}$ = current proportional to absolute temperature
$V_{BG}$ = band gap reference voltage
$R_{EX}$ = external resistor
$V_{be}$ = base to emitter voltage The part of a delta demodulation decoder shown in the FIGURE is designed for use in a digital audio broadcasting system. The FIGURE illustrates that part of the circuit which generates control currents. The decoder receives three data bit streams which represent the audio information to be decoded. Two of these are the control data bit streams, and one is the audio data bit stream. A clock signal is also received. Each of the data bit streams can be several channels of time multiplexed data. The clock is used as a strobe to select two of the channels of time multiplexed data for the decoder. In the discussion that follows duplicate components for the various channels will not be discussed and are not shown in the drawings.

The input to the temperative compensation section of the delta demodulation decoder using the present invention are two channels of audio and control data. A number of edge triggered D flip-flops 12, of which one is shown in FIG. 1, are used as input latches to store two channels of audio and control data. The clock is inverted internally to strobe the second channel. The FIGURE shows the configuration of the input logic circuits. The input buffers 14 have TTL thresholds and high input impedance which allows interfacing with both TTL and CMOS logic families. Since the present invention pertains to a compensation technique which allows the control signals within the decoder IC to be relatively independent of temperature, resistance, process variations and VCC, the description of the preferred embodiment will concentrate on the handling of the control bit streams in the circuit illustrated in the FIGURE. The control current $I_{SS}$, which is used to generate the amplitude of the output signal will be used as an example.

The two control data bits for each channel are for the step-size (SSB) and system de-emphasis (SBD) control. The information for the control data is encoded logarithmically in the duty cycle of the bit stream. For each of the control data bit streams, a three-pole 80 Hz., low-pass filter 16 is used to detect the average or DC value of the duty cycle. The resultant voltage is then exponentiated to expand the control signal into a 48 dB range.

To maintain system accuracy it is necessary to have precise control of the pulse height to be filtered. This is accomplished by using a switching amplifier 18 to drive the low-pass filter 16. As shown in the FIGURE, the latch output flip-flop 12 sets the switching rate between two voltage levels $V_L$ and $V_H$. These voltages are generated in the bandgap reference circuit 20 which produces a voltage VBG that is nearly independent of temperature, supply, the process variations. VBG is scaled up to a voltage $V_3$ and results in the fixed reference voltage $V_L$ as follows:

$$I_{10} = V_{BG}/R_{10}$$

$$I_{11} = I_{10} + I_B,$$

where $I_B$ is the base current and considered negligible therefore $I_{10} = I_{11}$ $$V_3 = V_{BG}\left(\frac{R_{10} + R_{11}}{R_{10}}\right)$$

$$V_L = V_3 - V_{be}(Q_6) + V_{be}(Q_7)$$

$$\frac{dV_L}{dT} = \frac{dV_3}{dT} = \frac{dV_{BG}}{dT} \text{ if } \frac{dV_{be}}{dT} (NPN) = \frac{dV_{be}}{dT} (PNP)$$

$Q_7$ collector current is $I_{PTAT}$ and ideally $Q_6$ collector current should be $I_{PTAT}$. Under these conditions $V_L$ would have the same temperature dependence as $V_3$ if the temperature coefficeint of NPN's equals the TC of PNP's. Therefore $V_3$ is proportional to $V_{BG}$ and has the same temperature coefficient. $V_M$ is chosen to be 40% of $V_H - V_L$. $V_H$ is a temperature sensitive voltage chosen to compensate for the temperature changes in $V_{be}$ discussed infra. A low temperature coefficient current $I_{REF}$ is generated by resistor $R_{EX}$, an external resistor, and is used in the exponentiator circuit.

$$V_4 = V_3 + V_{be}(Q_4) - V_{be}(Q_5)$$

setting $$V_{be}(Q_4) = V_{be}(Q_5),$$

then $$V_4 = V_3$$

and $$I_{REF} = \frac{V_4}{R_{EX}} = \frac{V_3}{R_{EX}}$$

The control signal at the ouput of the low-pass filter 16 is buffered by amplifier 22 and attenuated by resistors $R_4$ and $R_5$. The voltage buffered by amplifier 22 is $aV_H$ which is the average DC value of the bit stream of the duty cycle. $R_4$ and $R_5$ are chosen such that $$\frac{R_5}{R_4 + R_5} = \frac{1}{9}.$$

Hence the attenuated voltage, whcih is the input to the exponentiator, is $aV_H/9$. This voltage is temperature dependent.

The actual exponentiating transistor is $Q_1$ and its collector current is the control signal current. This current is in effect $I_{SS}$. To properly bias $Q_1$ and the other exponentiating transistors, a $V_R$ generator circuit is provided using transistor $Q_2$, amplifier $A_2$ and the reference current $I_{REF}$. Amplifier $A_2$ forces the base of $Q_2$ to be equal to $V_M/9$ and the emitter voltage to be $$V_E = \frac{V_M}{9} - V_T \ln \frac{I_{REF}}{I_S}.$$

Therefore the base emitter voltage $$V_{be} = V_T \ln \frac{IR}{IS}.$$

Since the current in $Q_2$ is fixed (for a given temperature), the $V_{be}$ of $Q_2$ is constant, which sets a constant reference voltage, $V_R$, for the exponentiating transistor $Q_1$.

The output of the exponentiating transistor $Q_1$ is a current $I_1$, which, depending on the circuit, is either $I_{SS}$ (step-size control) or $I_{SB}$ (system de-emphasis control) and which is independent of temperature, internal resistance and power supply. The circuit achieves this goal in the following fashion. Referring to the definitions where "a" is the duty cycle, "c" is a constant and the equation $V_T = KT/q$, for the voltage equivalent of temperature, the difference between the base emitter voltage of transistors $Q_1$ and $Q_2$ is expressed:

$$\Delta V_{be} = V_{be1} - V_{be2} = V_T \ln \frac{I_1}{I_{s1}} - V_T \ln \frac{I_2}{I_{s2}} \quad (1)$$

Since:
$I_1$ = collector current of $Q_1$
$I_2$ = collector current of $Q_2$
$I_{s1} = I_{s2}$ for purposes of this exposition, and $$I_2 = I_{REF} \quad (2)$$

(the reference current);
therefore, referring to equations (2) into equation (1) yields:

$$\Delta V_{be} = V_T \ln \frac{I_1}{I_{REF}}. \quad (3)$$

Since the actual voltage at the bases of $Q_1$ and $Q_2$ is known, substituting these values in equation (3) yields:

$$\Delta V_{be} = \frac{aV_H}{9} - \frac{V_M}{9} = \frac{1}{9}(aV_H - V_M) = V_T \ln \frac{I_1}{I_{REF}} \quad (4)$$

From which equation (5) follows:

$$I_1 = I_R e\left[\frac{(aV_H - V_m)}{9 V_T}\right] = I_R e\left[\frac{(aV_H - V_m)}{\frac{9 KT}{q}}\right] \quad (5)$$

At this point it should be remarked that the base currents of transistors $Q_1$ and $Q_2$ have been neglected because they have no substantial impact on the value of the current $I_1$, which is the output of the exponentiator. Equation (5) yields the value of $I_1$. To show that this value is independent of resistance and temperature we consider equations (6) through (9).

$$I_{PTAT} = c\frac{V_T}{R} = c\frac{KT}{q}\frac{1}{R} \quad (6)$$

where R = an internal resistor.

$$V_H = I_{PTAT}(R_1 + R_2) = c\frac{KT}{q}\frac{(R_1 + R_2)}{R} \quad (7)$$

From equation (7) it can be shown that $V_H$ is not changed from variations in resistance.

$$V_M = I_{PTAT}(R_2) = c\frac{KT}{q}\frac{R_2}{R} \quad (8)$$

$$aV_H - V_M = c\frac{KT}{q}\left[\frac{a(R_1 + R_2) - R_2}{R}\right] \quad (9)$$

Then substituting equation (9) into equation (5) yields equation (10) for the output current of the exponentiator.

$$I_1 = I_R e\left[\frac{c\frac{KT}{q}\frac{(a(R_1 + R_2) - R_2)}{R}}{9\frac{KT}{q}}\right] \quad (10)$$

From equation 10 it can be shown that $I_1$ is not changed from variations in temperature or resistance. Then, cancelling $$\frac{KT}{q} : I_1 = I_R e\left[\frac{c(a(R_1 + R_2) - R_2)}{9 R}\right] \quad (11)$$

The input signals to the exponentiator are purposely made temperature dependent and in particular dependent on the absolute temperature because the conversion of a voltage to a current is temperature dependent. Therefore, the two temperature dependencies are cancelled in the exponentiator. $V_H$ is temperature dependent because of $I_{PTAT}$. The resistance is cancelled out in the generation of $I_{PTAT}$ through $R_1$ and $R_2$ as shown in equation (7). Therefore $V_H$ is independent of the resistance.

The result of this technique is that the performance of the IC will be constant in spite of variations of temperature, process spreadings, internal resistance and $V_{CC}$. The frequency response and the gain of the circuit are controlled by the transmitted control bits, which have now been made independent of these variable since the output of the various exponentiators will be either $I_{SS}$.

Once the audio data is put into two channels in the circuit, it is sent to a multiplier circuit or variable impedance circuit. In a delta modulation system encoder, the audio data bits represent the signal slope of the input samples.

Thus the circuit and technique of the present invention provide the basis for a two channel decoder for use in a digital audio broadcasting system.

I claim:

1. A circuit for processing control signals is a control data signal decoder incorporating temperature and process variation compensation means comprising:
   means to generate a low temperature coefficient stable voltage independent of temperature, resistance and collector current for use as a control and reference voltage in said circuit;
   means to generate a stable reference current for use as a control and reference current in said circuit;
   means to receive and store temporarily a stream of logarithmically encoded control bits for a delta demodulation decoder;
   means to detect with a low pass filter the average dc value of the duty cycle of said control bit stream;
   means to control pulse height by using a switching amplifier, such that the output voltage which drives said filter is not a function of supply voltage; and
   means to exponentiate said output voltage using said reference voltage and said reference current to yield a stable control signal current.

2. A circuit for processing the control signal for a control data signal digital audio decoder comprising:
   means to latch and store momentarily a bit stream of input signals;
   means to clock bits of said bit stream to one or more channels;
   a bandgap generator to generate precise high and low voltages in conjuction with a current proportional to absolute temperature;
   means to feed the bit stream of one of said channels to a switching amplifier, the output of said switching amplifier being a bit stream with a precise high and low voltage, using the voltages generated by said band gap generator;
   a low pass filter receiving the ouput of said switching amplifier, whose output is the average dc value of the duty cycle of a bit stream;
   an attenuator to reduce the full scale value range of the voltage of said filter output;
   an exponentiator to convert the attenuated voltage exponentially to a control signal current;
   wherein the exponential conversion of control voltage is inversely proportional to temperature and said attenuated voltage is chosen to be dependent on a current proportional to absolute temperature, so that variations in temperature will cancel, leaving an output control signal current independent of temperature; and
   wherein an internal resistor is used in the generation of a reference current which is independent of internal variations and internal resistors are used to generate a current proportional to absolute temperature which are ratioed to cancel their variations.

\* \* \* \* \*